United States Patent
Spalink

(10) Patent No.: US 6,920,189 B1
(45) Date of Patent: Jul. 19, 2005

(54) CARRIER RECOVERY MEANS

(75) Inventor: Gerd Spalink, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 702 days.

(21) Appl. No.: 09/602,511

(22) Filed: Jun. 23, 2000

(30) Foreign Application Priority Data

Jun. 25, 1999 (EP) .............................. 99112273

(51) Int. Cl.⁷ .......................................... H04L 27/38
(52) U.S. Cl. ...................................... 375/326
(58) Field of Search ................... 375/326, 316, 375/269, 272, 279, 324, 371, 376, 327, 375, 136, 137, 148, 147, 149

(56) References Cited

U.S. PATENT DOCUMENTS

| | | | | |
|---|---|---|---|---|
| 4,888,564 A | * | 12/1989 | Ishigaki ....................... 331/1 A |
| 4,968,955 A | | 11/1990 | Yoshida et al. ............. 329/304 |
| 5,001,727 A | | 3/1991 | McDavid ...................... 375/80 |
| 5,315,618 A | | 5/1994 | Yoshida ........................ 375/94 |
| 5,471,508 A | | 11/1995 | Koslov ........................ 375/344 |
| 5,553,098 A | * | 9/1996 | Cochran et al. ............. 375/324 |
| 5,875,213 A | | 2/1999 | Asami et al. ................ 375/336 |
| 6,038,267 A | * | 3/2000 | Oura et al. ................... 375/329 |
| 6,075,408 A | * | 6/2000 | Kullstam et al. ............ 329/304 |
| 6,148,039 A | * | 11/2000 | Coman et al. ............... 375/326 |
| 6,490,010 B1 | * | 12/2002 | Shibuya et al. .............. 348/735 |
| 6,493,396 B1 | * | 12/2002 | Nguyen et al. .............. 375/329 |
| 6,577,690 B1 | * | 6/2003 | Barman et al. .............. 375/354 |

FOREIGN PATENT DOCUMENTS

| | | | |
|---|---|---|---|
| EP | 0 526 836 | 2/1993 | ........... H04L/27/22 |
| WO | WO 93 15552 | 8/1993 | ............ H03H/7/30 |

* cited by examiner

Primary Examiner—Mohammed Ghayour
Assistant Examiner—Dung X. Nguyen
(74) Attorney, Agent, or Firm—Frommer Lawrence & Haug LLP; William S. Frommer; Darren M. Simon

(57) ABSTRACT

The present invention relates to a carrier recovery means in particular in a channel decoding unit or a digital demodulating unit of a digital broadcasting receiver. The inventive carrier recovery means comprises at least first and second phase error detecting means (2, 4) in which the first phase error detecting means (2) generates a robust phase error signal based on a digital input signal. Said second phase error detecting means (4) receives said robust phase error signal and generates therefrom a frequency sensitive phase error signal which is representative for the frequency error or frequency offset between the frequency of the receiver and the frequency of the carrier of the received digital input signal. The frequency sensitive phase error signal is then used to reduce at least the frequency error with respect to the received digital input signal to enable locking of the receiver to the carrier of the digital signal.

18 Claims, 5 Drawing Sheets

CARRIER RECOVERY MEANS

FIELD OF THE INVENTION

The present invention relates to a carrier recovery means according to the wording of claim 1.

BACKGROUND OF THE INVENTION

In digital broadcasting receivers before correct receiving of transmitted data it is necessary to lock the system, i.e. the receiving device, to the correct frequency and the phase of the carrier of the distinct channel or signal to be received. Dependent on the particular transmission mode—via satellite, cable, or terrestrial transmission—certain modulations of the signals are employed, for instance QPSK, QAM, COFDM, respectively, for the aforementioned transmission modes.

For locking conventional receiving devices to the correct phase and frequency of the carrier signal, a phase and frequency detector is employed. Usually, the output of the detector is fed back to a phase de-rotator or frequency shifter within a phase locked loop (PLL). The phase locked loop achieves as a feedback loop successive corrections of the frequency and the phase of the receiving device until the system is locked to the correct frequency in phase of the signal to be received and evaluated.

When the system is not locked to the correct frequency and a frequency offset or frequency difference between the system frequency and the frequency of the carrier signal exceeds some limit, the phase error or phase difference between the system and the carrier signal changes in time periodically with a time average of the phase error or phase difference vanishing or being zero. A vanishing time average in the phase difference or phase error cannot give an indication for the PLL in which direction the system frequency has to be corrected to lock to the correct carrier frequency.

It is therefore an object of the present invention to provide a carrier recovery means in particular for a channel decoding unit and/or a digital demodulating unit particularly provided in a digital broadcasting receiver with an improved locking behavior which is capable of locking to the correct phase and frequency of a carrier signal in a reliable manner and in a particular short time.

This particular object is achieved by a carrier recovery means according to the present invention with the features of claim 1. Preferred and advantageous embodiments of the inventive carrier recovery means are within the scope of the dependent subclaims.

SUMMARY OF THE INVENTION

The Inventive carrier recovery means—in particular in a channel decoding unit and/or a digital demodulating unit being particularly provided in a digital broadcasting receiver—for recovering a carrier of a received digital input signal comprises at least first and second phase error detecting means. Said first phase error detecting means is also called robust phase error detecting means and is adapted for detecting a first or robust estimate for the phase error of the received digital input signal. It is further adapted for generating and/or for outputting a first or robust phase error signal being representative for said first or robust phase error. Of course, said first or robust phase error signal may be identical with said first or robust phase error itself. According to the invention said second phase error detecting means is adapted for receiving a phase error signal from said first phase error detecting means and in particular said first or robust phase error signal and for deriving therefrom at least a second or frequency sensitive phase error signal which is representative for at least the sign of the frequency error or offset between the system and the received digital input signal or the carrier signal. The second phase error detecting means is also called frequency sensitive phase error detecting means. Further according to the invention the generated second or frequency sensitive phase error signal is used to reduce at least the frequency error or frequency offset with respect to the received digital input signal to enable locking—of the system—to at least the carrier frequency or the frequency of the received digital input signal.

A basic idea of the present invention is therefore to generate by means of said frequency sensitive phase error detecting means a measure for the direction in which the frequency offset or error between the receiving system and the carrier signal has to be corrected. This is achieved at least by the fact that a derived second or frequency sensitive phase error signal represents at least the sign of the frequency error or frequency offset between the system and the received digital signal or carrier frequency. The sign—i.e. the direction of the error or offset of the frequency—gives the indication in particular for the PLL to carry out a correction in the frequency in the opposite direction of the sign of the frequency error.

According to a preferred and advantageous embodiment of the inventive carrier recovery means the second or frequency sensitive phase error detecting means comprises at least a subtracting, differentiating unit, a first limiting unit, and an adding/integrating unit which are in particular connected in series in that order.

Said subtracting/differentiating unit is adapted to receive a phase error signal from said first or robust phase error detecting means and in particular said first or robust phase error signal as an input signal. It is further adapted to generate and/or to output a difference/differential signal from the received phase error signal.

Said first limiting unit is adapted to receive said difference/differential signal as an output signal and to generate and/or output a limited signal thereof which does not exceed given first lower and/or upper limits.

The combination of the subtracting/differentiating unit and the first limiting unit produces a signal in particular from the first or robust phase error signal provided by the first or robust phase error detecting means which represents more or less the velocity of change of the phase error or phase difference between the system and the digital input signal. This signal—bounded to certain limits—is therefore an indication for the frequency difference or offset between the system frequency and the carrier frequency as the time variation and the phase error between the system and the carrier signal is strictly proportional to the frequency offset.

According to another preferred embodiment of the inventive carrier recovery means, said adding/integrating unit is adapted to receive said limited difference/differential signal and to generate and/or output a sum/integral signal thereof.

The succession of the subtracting/differentiating unit and the adding/integrating unit re-generates a measure in particular for the first or robust phase error signal in which phase jumps are avoided or at least reduced according to the action of the first limiting unit. The lower and/or upper limits of the first limiting unit may be chosen in a way that the re-generated or restored robust phase error signal—i.e. the integral or the limited differential robust phase error signal—does not change its sign for a frequency offset between the system and the carrier signal with a constant sign.

In a preferred embodiment of the inventive carrier recovery means a second limiting unit is provided which is connected in particular in series to said adding/integrating unit. Said second limiting unit is adapted to receive said sum/integral signal, i.e. the integral of a limited differential (robust) phase error signal—and to generate and/or output a limited signal thereof which does not exceed given second lower and/or upper limits.

The provision of the second limiting unit bounds the integral of the limited differential signal of the—in particular robust—phase error signal to certain lower and/or upper limits and generates therefore a lower and/or upper saturation value which represents the sign of the frequency offset between the system frequency and the carrier frequency.

If the receiving conditions are poor, first a robust phase error detecting means may generate a first or robust phase error signal which suffers from the poor receiving conditions. In a further advantageous embodiment of the inventive carrier recovery means it is therefore provided that said first or robust phase error detecting means is adapted to generate and/or output a valid robust phase error signal of the received digital input signal—if, and only if—the signal strength or signal amplitude of the received digital input signal is above a given threshold. Furthermore, said second phase error detecting means is adapted to use said valid robust phase error signal only for generating said frequency sensitive phase error signal.

In a further preferred embodiment of the inventive carrier recovery means lock detector means is provided which is adapted to receive a phase error signal and to generate and/or output a locking signal and a phase error signal and/or an average value thereof is beyond a given threshold.

Said lock detector means therefore monitors the time evolution of a phase error signal. In the case that the phase error or its time evolved average value does not exceed a certain limit, a locking signal is generated and/or output which represents the locking of the system to a frequency which is in the close neighborhood of or identical to the frequency of the carrier signal.

It is advantageous that said lock detector means is adapted to use said robust phase error signal and in particular said valid robust phase error signal provided by said first phase error detecting means.

In the latter case complications and disturbances according to poor transmission or receiving conditions are avoided.

The inventive carrier recovery means may work as a frequency error detector and/or corrector as well as a phase error detector and/or corrector. A further basic idea is therefore, to use the detected phase error and the time evolution thereof to correct the frequency error or frequency offset between the system frequency and the frequency of the carrier signal. Then—after locking the system to the correct carrier frequency or to a frequency in the close neighborhood of the carrier frequency—the carrier recovery means may switch—in particular by generating said locking signal—to a phase mode. In said phase mode the phase difference or phase error between the system and the carrier signal is small compared to the frequency mode in which the phase error changes rapidly with time according to the frequency difference or offset between the system and the carrier signal.

According to a further preferred embodiment of the inventive carrier recovery means a third or precise phase error detecting means is provided which is adapted for receiving said digital input signal and to generate and/or to output a certain precise phase error signal, in particular in the case when the system is locked to a certain frequency at least in the neighborhood of the carrier frequency—i.e. when the locking signal is provided by lock detector means. It therefore may exhibit for small phase errors—e.g. less than 8 degrees for 64 QAM—much less noise than said first or robust phase error detecting means. It also may use a detecting circuit completely different in construction from that of said first or robust phase error detecting means.

The inventive carrier recovery means according to the invention acts as a frequency/phase error detector and/or corrector and works mainly according to the following ideas:

A simple or robust phase error detector is used to determine and estimate the phase error between the system and the received digital input signal by means a first or robust phase error signal. For more complicated input signals—for instance for higher order QAM signals—this simple detector only gives reliable results if the absolute value or amplitude of the input signal is high enough and in particular exceeds a certain threshold. In the case of phase error estimates which are riot reliable, a sufficient phase error estimate might be produced by said first or robust phase error detector from either the previous valid phase error signal being stored in some register or by a zero value. This particular phase error signal can be output and used in particular when frequency locking has been detected and obtained.

When frequency lock has not yet been obtained, the phase error between the system and the carrier signal shows a monotone behavior and possesses phase jumps. For positive frequency errors or offsets this monotone behavior is positive. It is vice versa negative for negative frequency offsets. In both cases the average value of the frequency error offset is zero and gives no indication in which direction a frequency or phase correction has to be driven in particular by the phase locked loop PLL.

To overcome these difficulties with the time variation of the phase error, the inventive carrier recovery means generates a phase error signal which is at least representative for the sign of the phase error, which per se represents also the sign of the frequency offset between the system frequency and the carrier frequency. Therefore, the inventive carrier recovery means possesses said differentiate-limit-integrate-limit operation as described above. The serial operation of the differentiation and integration without limiting the certain signals would yield or restore the phase error signal identically, but there may be a DC shift. The limiting units after the differentiating unit clips the peaks resulting from the phase jumps.

The integrating section restores the original waveform of the phase error signal except for the jumps. Therefore, a DC shift occurs compared to the original phase error signal.

The limiting unit after the integrating unit improves the reliability of the signal output for noisy input signals.

Another advantage of the inventive implementation is that it has a finite word length in this case. Therefore, the sign of the output phase error signal is the same as of the frequency offset or frequency error. Therefore, the phase locked loop PLL can be forced and driven into the correct direction to make the frequency error between the system and the carrier signal reduced or even zero. Once the frequency error between the system and the carrier signal is reduced to a certain threshold or is zero, the inventive carrier covering means will switch to a phase mode in which a precise phase error detecting means may produce a precise phase error signal to make the phase error reduced or even zero.

In a more advantageous implementation of the inventive carrier recovery means, a limiting unit after the subtracting/differentiating unit outputs the differential phase error signal to the PLL instead of clipping the signal to reduce the frequency offset between the system and the carrier signal. That means that the time differential of the phase error signal is used as a frequency offset signal to drive the feedback loop of the PLL.

According to the present invention it is not necessary to have a forced frequency sweep for the correction of the frequency offset because the carrier recovery means—as a frequency error detector—directs the loop PLL into the correct direction to reduce and/or nullify the frequency error or offset.

A further advantage of the inventive carrier recovery means over state of the art devices is its full digital carrier recovery capability without employing external analog PLL components. No outer loop is necessary.

The present invention will be understood in more detail together with its numerous modifications and advantages from the following detailed description based on preferred embodiments and by means of the accompanying drawings, wherein.

DETAILED DESCRIPTION OF THE DRAWINGS

Figure 1:
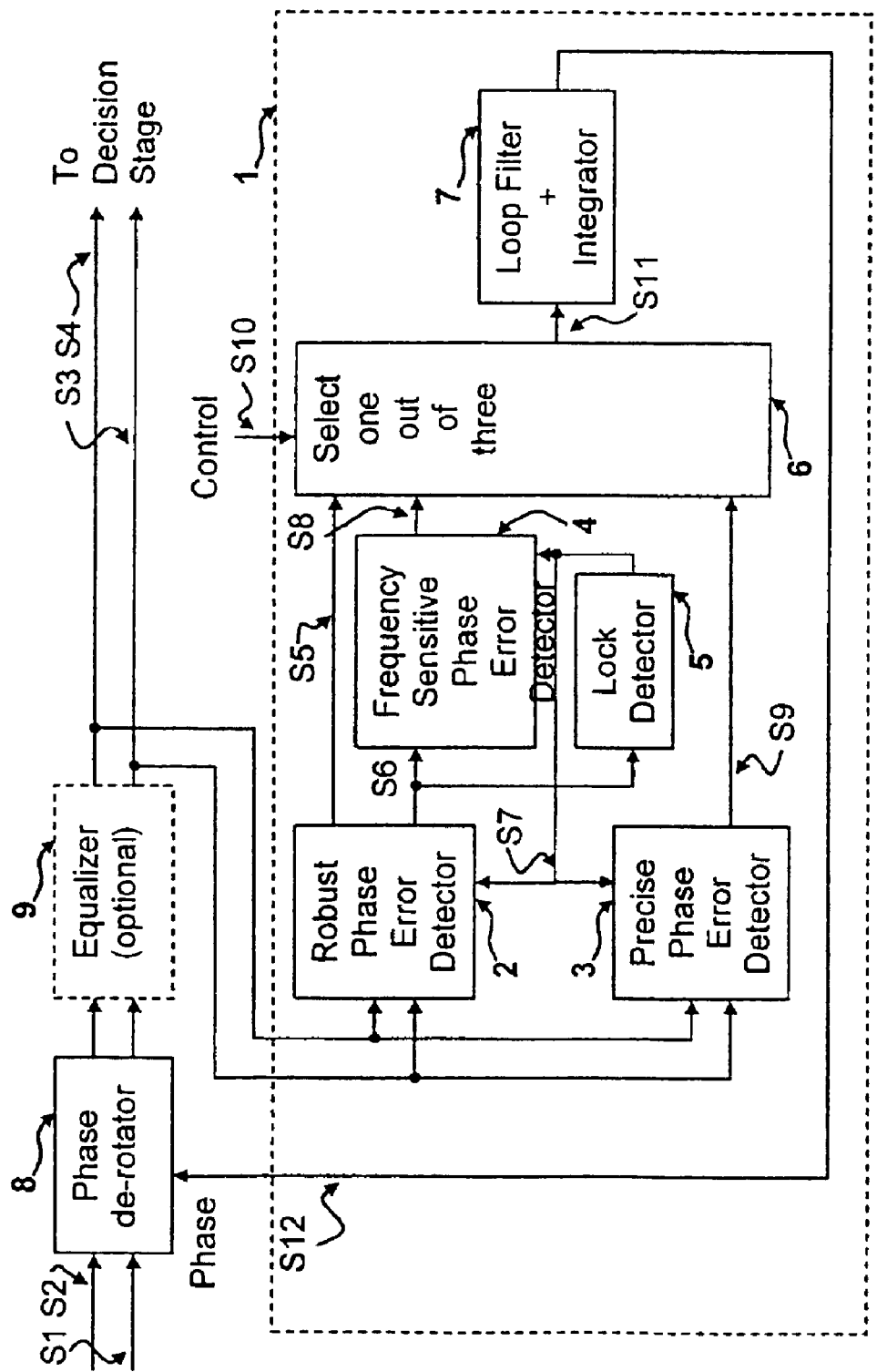
FIG. 1 is a schematical drawing of an embodiment of the inventive carrier recovery means.

FIG. 1 shows by means of a schematical block diagram the implementation and general structure of an embodiment of the inventive carrier recovery means 1.

Carrier recovery means 1 is connected to output lines S3 and S4 of preprocessing stages of a digital broadcasting receiver. These pre-processing stages may include a phase de-rotator 8 and an optional equalizer 9. The preprocessing stages 8 and 9 receive an input signal via lines S1 and S2, which may supply in the case of a QAM signal the in-phase part and the quadrature part of the QAM signal, respectively. For QPSK and COFDM signals the appropriate signal parts are supplied by lines S1 and S2 to the pre-processing stages 8 and 9.

Main parts of the inventive carrier recovery means 1 are a first or robust phase error detector 2, a second or frequency sensitive phase error detector 4, a lock detector 5, and a precise phase error detector 3. The distinct phase error detectors 2, 3, and 4 supply distinct phase error signals via lines S5, S8, and S9 to a selection unit 6 which is externally controlled by a control unit connected to the selection unit 6 by line S10. A selected phase error signal is supplied by selection means 6 via line S11 to a loop filter and integrator section 7 which feeds back a frequency and/or phase correction signal by line S12 to the phase de-rotator 8 to correct the frequency and/or phase error with respect to the digital input signal on lines S1 and S2.

Robust phase error detector 2 receives the pre-processed digital signal from lines S3 and S4 as an input signal. Robust phase error detector 2 then evaluates said input signals supplied by lines S3 and S4 and provides (robust) phase error signals as output signals on lines S5 and S6, the latter of which being a valid (robust) phase error signal for the case that the signal amplitude of the pre-processed input signal on lines S3 and S4 exceeds a certain threshold and ensuring an appropriate determination of a reliable, i.e. valid phase error signal.

Valid phase error signal is supplied by line S6 to the second or frequency sensitive phase error detecting means 4 as well as to the (frequency) lock detector 5, the latter of which evaluating the time evolution of the robust phase error signal on line 56 and generating and/or outputting a (frequency) lock signal in the case that the time variation of the robust phase error signal is small in some sense and/or that no phase jumps occur indicating that the system has been locked to the correct frequency.

Frequency sensitive phase error detecting means 4 evaluates the robust phase error signal supplied by line S6 to generate and/or output a second or frequency sensitive phase error signal—in particular in the case when the system is not locked to the correct carrier frequency—the frequency sensitive phase error signal being at least representative for the sign of the phase error which indicates the direction in which the system frequency has to be corrected to get the system locked to the correct carrier frequency. The frequency sensitive phase error signal is supplied to the selection unit 6 by line S8.

When frequency locking has been detected by the lock detector 5 the third or precise phase error detecting means 3 is enabled to generate and output a precise phase error signal on line S9 based on pre-processed input signals on lines S3 and S4. Thus, precise phase error detecting means 3 is only enabled when the system has been locked to a correct carrier frequency to correct for the remaining phase error between the system, i.e. the digital broadcasting receiver, and the received carrier signal.

Figure 2:
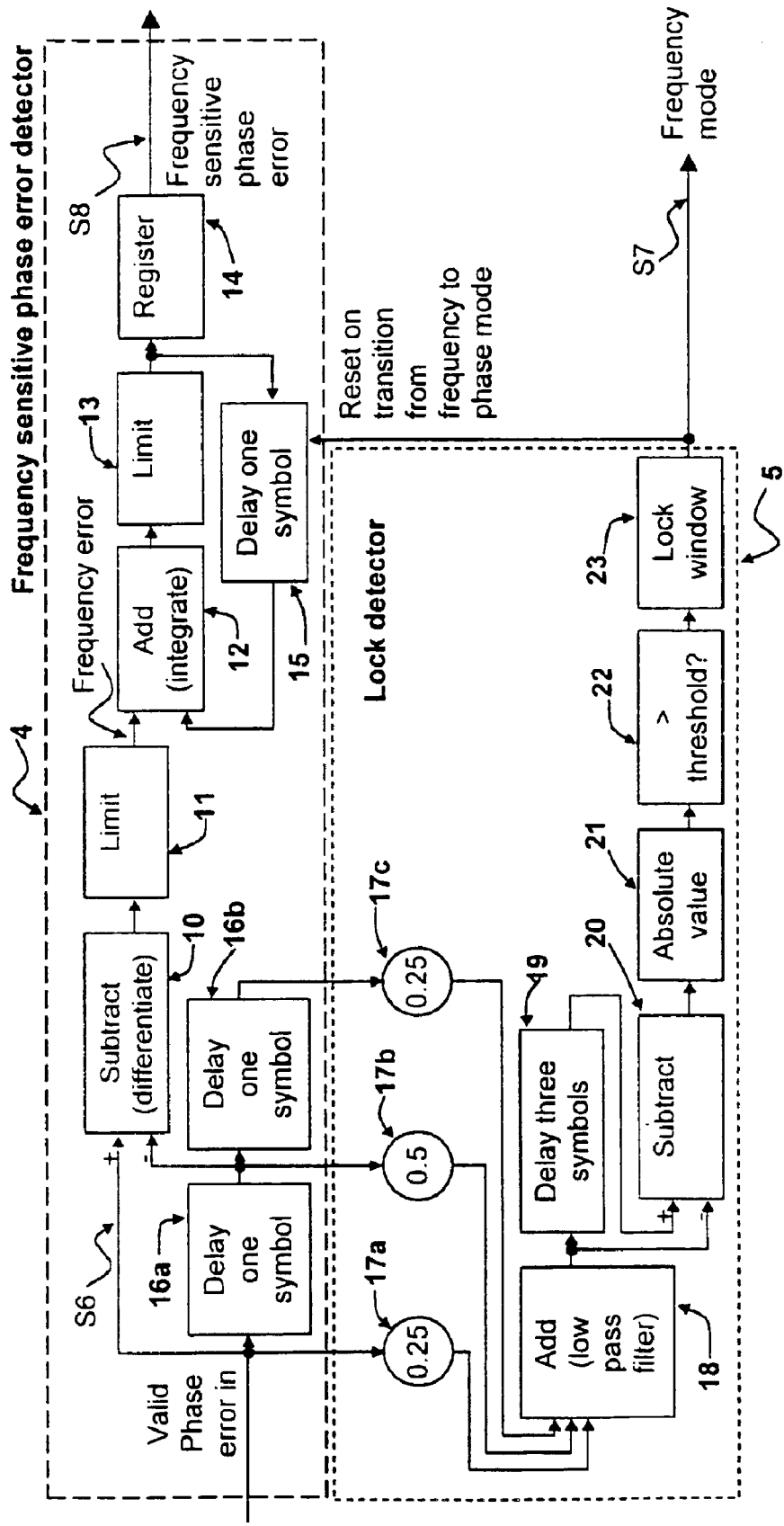
FIG. 2 is a schematical drawing of an embodiment of the frequency sensitive phase error detecting means employed by the inventive carrier recovery means.

FIG. 2 shows by means of a schematical block diagram details of the second or frequency sensitive phase error detecting means or detector 4 and of the (frequency) lock detector means 5.

Second or frequency sensitive phase error detecting means 4 receives the robust phase error signal provided by said first or robust phase error detecting means 2 on line S6. This received phase error signal is in particular a valid robust phase error signal as described above. In connection with a first delay section 16a a subtracting/differentiating unit 10 generates a difference signal or differential signal from the input signal of line S6 which is then limited by the following limiting unit 11.

The output of the limitor 11 may serve as a frequency error signal as the limited difference/differential signal describes the time variation of the phase error between the system and the received input signal and is therefore an indication of the frequency offset of frequency error between the system and the carrier signal.

The output signal of said first limiting unit 11 is then fed to an adding/integrating unit 12 which is adapted to generate and output a sum/integral signal which is then limited by the following second limiting unit 13. In the process of adding/integrating the error signal again a delay section 15 is employed. After passing a register unit 14 a frequency sensitive phase error signal is output by frequency sensitive phase error detecting means 4 on line S8.

To decide on whether or not the system is locked to the correct frequency, i.e. to the frequency of the carrier signal, said lock detector means 5 evaluates an average signal generated from said robust phase error signal and in particular from said valid robust phase error signal supplied on line S6.

To do so—in the case of the embodiment of FIG. 2—said lock detector 5 receives a block of three data symbols in succession. Therefore delay units 16a and 16b are employed. The three successive data symbols are multiplied by distinct and pre-defined weighting factors in the multiplying units 17a, 7b, and 17c, in this distinct case representing weighting factors of 0.25, 0.5, and 0.25, respectively.

These three successive and weighted symbols are supplied to an adding and low pass filter section 18. The output of the adding section 18 is supplied to a subtracting unit 20 which generates the difference between successive triples of data symbols. Then the absolute value of the distinct difference is calculated in unit 21. If the absolute value is beyond a given threshold—which is tested in section 22—this is an indication that the time variation of the phase error is appropriate small and therefore, that the difference of the system frequency and the carrier frequency is appropriate small too. In that particular case, frequency locking is detected and a frequency mode or locking signal is generated in lock detector means 5 and output on line S7.

Figure 3:
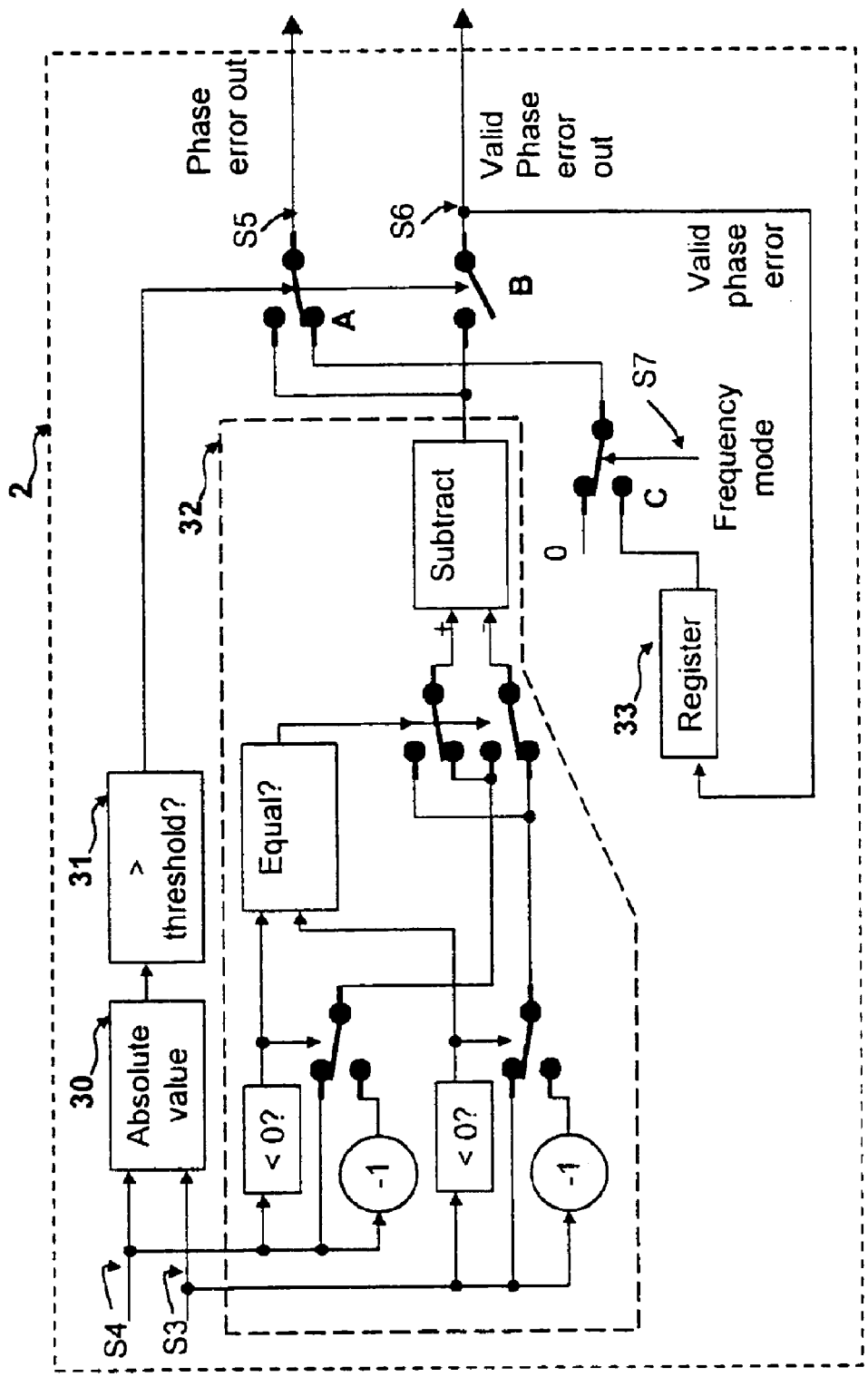
FIG. 3 is a schematical drawing of an embodiment of an robust phase error detecting means employed by the inventive carrier recovery means.

FIG. 3 shows by means of a schematical lock diagram details of said first or robust phase error detecting means 2.

First or robust phase detecting means 2 receives a pre-processed received digital input signal on lines S3 and S4. The pre-processed input signal is on the one hand supplied to determine its absolute value in section 30 and to determine on whether or not its absolute value or amplitude exceeds a necessary threshold to be reliably further analyzed in comparison section 31. On the other hand, the input signal on lines S3 and S4 is supplied to a phase error calculating unit 32 which is adapted to calculate a phase error or phase error signal based on said input signal.

A reliable phase error can only be calculated for input signals which exceed a given threshold with respect to the amplitude as low and noisy signals are not a good basis for an evaluation. Therefore, first or robust phase error detecting means 2 provides the calculated phase error signal on line 35 which is identical to the calculated phase error signal on line S6, if and only if said threshold is exceeded by said digital input signal. This is accomplished by switches A and B being controlled by said comparison unit 31.

FIG. 3 shows the case where switch A is in its lower position and switch B is open indicating that the amplitude of the signals on lines S3 and S4 is below said threshold. In that particular case line S6 shows no signal at all, in particular no valid robust phase error signal. On line S5 either 0 or the last valid phase error signal stored in register 33 is output, depending on whether or not the system is in the frequency mode. The frequency mode signal or locking signal on line S7 is therefore used to control switch C of the first or robust phase error detecting means 2.

Figure 4:
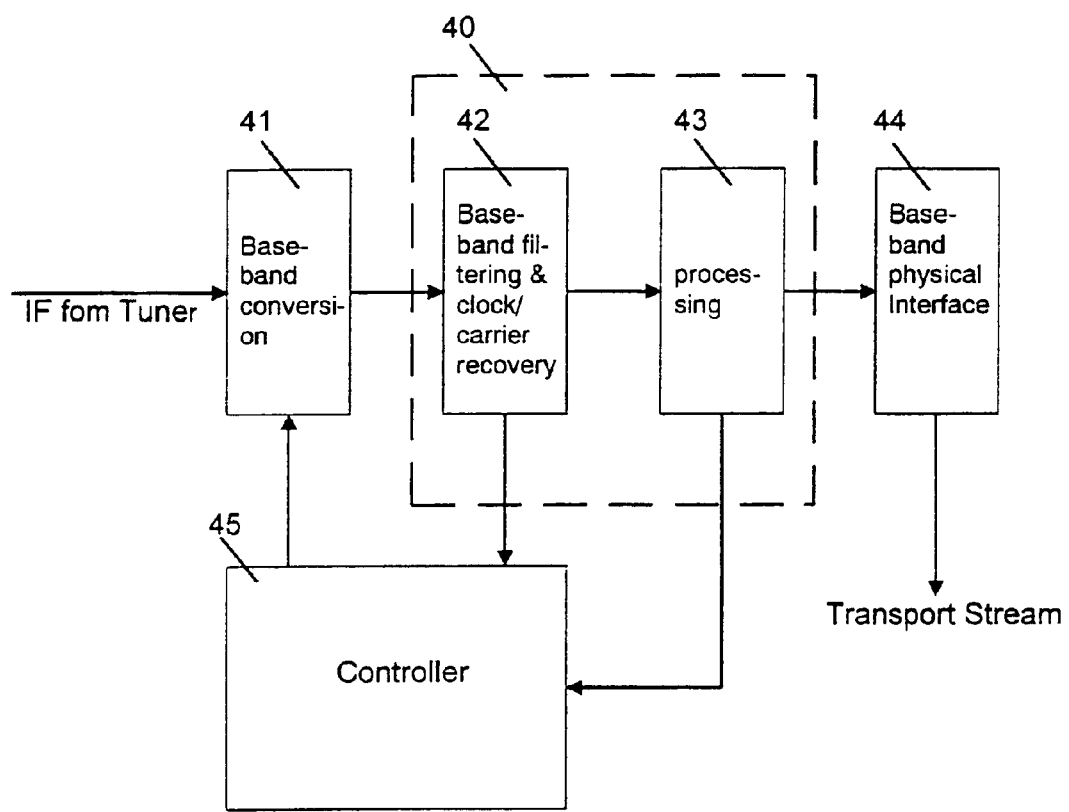
FIG. 4 is a block diagram of a channel decoding means within a digital broadcasting device employing an embodiment of the inventive carrier recovery means.

FIG. 4 shows the global organization of the inventive carrier recovery means 1 within a system of a digital broadcasting receiver.

Within said digital broadcasting receiver a baseband conversion section 41 receives an IF-signal (intermediate frequency signal) from a digital broadcasting tuning section. After baseband conversion the signal is fed into the so-called channel decoding unit or channel decoder 40 which supplies output signals to a controlling section 45 and to a baseband physical interface 44 which outputs the transport stream of data for further processing. Within said channel decoder 40 the inventive carrier recovery means 1 is organized within a baseband filtering & clock-carrier recovery section 42 which is followed by several stages of further processing contained in section 43 which may include different coding/decoding units.

Figure 5:
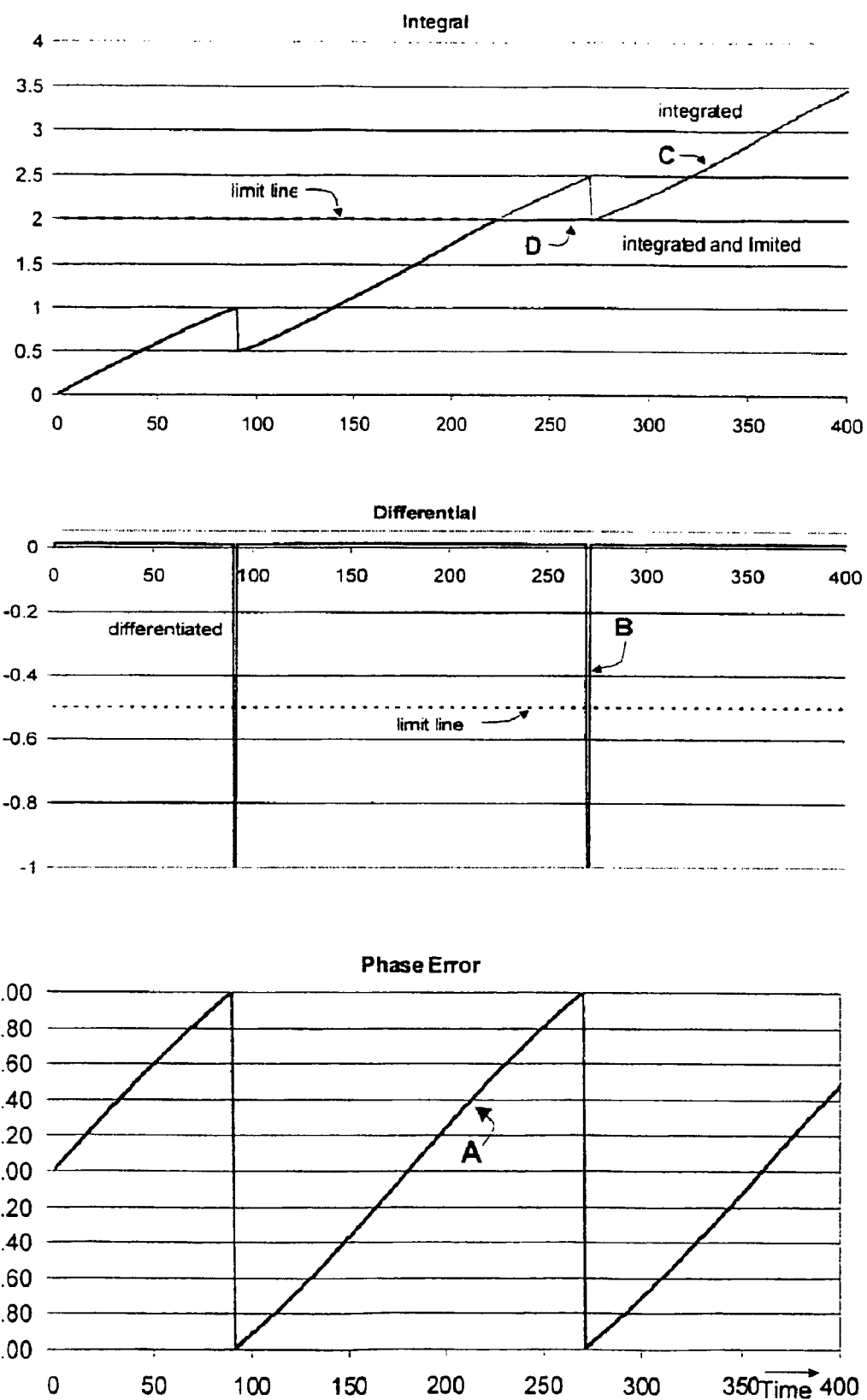
FIG. 5 is a plot showing a phase error signal and levels of its further processing carried out by an embodiment of the inventive carrier recovery means.

FIG. 5 describes by means of a plot the time evolution of the phase error signal and the corresponding evaluated and further processed phase error signals.

Trace A shows the time evolution of said valid robust phase error signal supplied on line S6 as shown in FIGS. 1, 2, and 3. This phase error signal, increases monotonically and includes jumps at equally spaced apart times. These jumps or discontinuities in the phase error signal are the reason for the difficulties in evaluating the phase error signal directly.

After subtracting or differentiating the phase error signal of trace A one arrives at trace B which demonstrates the differential signal corresponding to the, phase error signal of trace A. The signal of trace B is the result of the action of subtracting/differentiating unit 10 of FIG. 2 within said inventive frequency sensitive phase error detecting means 4. Within the graph of trace B also the limit line for the limiting unit 11 of FIG. 2 is shown.

The signal of trace B is further processed in the first limiting unit 11 and in the adding/integrating unit 12 of FIG. 2 which results in trace C in FIG. 5 and shows the integral of the limited signal of trace B.

According to the action of the second limiting unit 13 of the embodiment of FIG. 2 the limited signal of trace D saturates at the limiting value of 2 in this case.

Trace C and the saturation value of trace D are indicative for a positive frequency offset between the system frequency and the frequency of a digital input or carrier signal. In the case of a negative frequency offset the slope of trace A would be inverted with respect to the abscissa of the graph of trace A. Therefore, each of the traces B, C, and D would also be inverted with respect to the distinct abscissas and would finally lead to a negative saturation value of trace D indicating in that case a negative offset between the system frequency and the frequency of the input signal or carrier signal.

The saturation value therefore represents the sign of the frequency error and therefore the direction in which the loop filter and integrator section 7 has to act to supply a correct control to the phase de-rotator 8 of the embodiment of FIG. 1 on line S12.

What is claimed is:

1. Carrier recovery means—in particular in a channel decoding unit and/or a digital demodulating unit being particularly provided in a digital broadcasting receiver—for recovering a carrier of a received digital input signal, comprising at least first and second phase error detecting means, in which:

said first phase error detecting means is adapted for detecting a robust estimate for the phase error of the received digital input signal and for generating and outputting a robust phase error signal representative of said robust phase error, said second phase error detecting means is adapted for receiving the robust phase error signal from said first phase error detecting means and for deriving therefrom a frequency sensitive phase error signal which is representative of the sign of the frequency error with respect to the received digital, and said frequency sensitive phase error signal is used to reduce the frequency error with respect to the received digital signal to enable locking to at least the carrier thereof.

2. Carrier recovery means according to claim 1, characterized in that said second phase error detecting means comprises at least a subtracting/differentiating unit, a first limiting unit, and an adding/integrating unit which are connected in series.

3. Carrier recovery means according to claim 2, characterized in that said subtracting/differentiating unit is adapted to receive said robust phase error signal as an input signal and to generate and output a differential signal.

4. Carrier recovery means according to claim 3, characterized in that said first limiting unit is adapted to receive said differential signal as an input signal and to generate and output a limited signal not exceeding given first lower and/or upper limits.

5. Carrier recovery means according to claim 4, characterized in that said adding/integrating unit is adapted to receive said limited differential signal as an input signal and to generate and output a sum signal.

6. Carrier recovery means according to claim 5, characterized in that a second limiting unit is provided which is connected in series to said adding/integrating unit, and said second limiting unit is adapted to receive said sum signal as an input signal and to generate and output a limited signal not exceeding given second lower and/or upper limits.

7. Carrier recovery means according to claim 1, characterized in that said first phase error detecting means is adapted to generate and output a valid robust phase error signal of the received digital input signal when an amplitude of the received digital input signal is above a first threshold, and said second phase error detecting means is adapted to use only said valid robust phase error signal as an input signal only for generating said frequency sensitive phase error signal.

8. Carrier recovery means according to claim 1, characterized in that lock detector means is provided which is adapted to receive a phase error signal and to generate and output a locking signal therefrom when said phase error signal and/or an average value thereof is beyond a second threshold.

9. Carrier recovery means according to claim 8, characterized in that said locking detector means is adapted to use said robust phase error signal and said valid robust phase error signal supplied by said first phase error detecting means.

10. A method of carrier recovery for recovering a carrier of a received digital input signal in a channel decoding unit or a digital demodulating unit of a digital broadcasting receiver, comprising the steps of:

detecting a robust estimate of the phase error for the received digital input signal;

generating and outputting a robust phase error signal representative of said robust phase error; and deriving a frequency sensitive phase error signal from the robust phase error signal, said frequency sensitive phase error signal being representative of the sign of the frequency error with respect to the received digital input signal and being used to reduce the frequency error with reset to the received digital signal to enable locking to at least the carrier thereof.

11. The method according to claim 10, wherein said frequency sensitive phase error signal is detected by a second phase error detector comprising at least a subtracting/differentiating unit, a first limiting unit, and an adding/integrating unit which are connected in series.

12. The method according to claim 11, wherein said subtracting/differentiating unit is adapted to receive said robust phase error signal as an input signal and to generate and output a differential signal.

13. The method according to claim 12, wherein said first limiting unit is adapted to receive said differential signal as an input signal and to generate and output a limited signal not exceeding given first lower and/or upper limits.

14. The method according to claim 13, wherein said adding/integrating unit is adapted to receive said limited differential signal as an input signal and to generate and output a sum signal.

15. The method according to claim 14, wherein a second limiting unit is provided which is connected in series to said adding/integrating unit, and is adapted to receive said sum signal as an input signal and to generate and output a limited signal not exceeding given second lower and/or upper limits.

16. The method according to claim 10, further comprising a step of generating and outputting a valid robust phase error signal of the received digital input signal when an amplitude of the received digital input signal is above a first threshold, and generating said frequency sensitive phase error signal using only said valid robust phase error signal as an input signal.

17. The method according to claim 10, further comprising a step of generating and outputting a locking signal from a phase error signal when said phase error signal and/or an average value thereof is beyond a second threshold.

18. The method according to claim 17, wherein said locking signal is generated using said robust phase error signal and said valid robust phase error signal.

* * * * *